United States Patent
Im et al.

(10) Patent No.: US 9,954,049 B2
(45) Date of Patent: Apr. 24, 2018

(54) CIRCULAR DISPLAY DEVICE AND MANUFACTURING METHOD THEREFOR

(71) Applicant: KOLONAUTO CO., LTD., Hongseong-gun, Chungcheongnam-do (KR)

(72) Inventors: Woo-Bin Im, Hongseong-gun (KR); Kee-Yong Oh, Hongseong-gun (KR); Il-Ho Park, Hongseong-gun (KR); Chung-Hyoun Gyoung, Hongseong-gun (KR)

(73) Assignee: KOLONAUTO CO., LTD., Hongseong-gun, Chungcheongnam-do (KR)

( * ) Notice: Subject to any disclaimer, the term of this patent is extended or adjusted under 35 U.S.C. 154(b) by 0 days.

(21) Appl. No.: 15/314,788

(22) PCT Filed: May 28, 2015

(86) PCT No.: PCT/KR2015/005333
§ 371 (c)(1),
(2) Date: Nov. 29, 2016

(87) PCT Pub. No.: WO2015/182999
PCT Pub. Date: Dec. 3, 2015

(65) Prior Publication Data
US 2017/0200780 A1 Jul. 13, 2017

(30) Foreign Application Priority Data

May 30, 2014 (KR) .................. 10-2014-0066133
Jul. 10, 2014 (KR) .................. 10-2014-0086834

(51) Int. Cl.
*H01L 27/32* (2006.01)
*H01L 27/12* (2006.01)
*H01L 51/52* (2006.01)

(52) U.S. Cl.
CPC ........ *H01L 27/3276* (2013.01); *H01L 27/124* (2013.01); *H01L 51/5253* (2013.01)

(58) Field of Classification Search
CPC ... H01L 27/32; H01L 27/3276; H01L 27/124; H01L 51/5253
See application file for complete search history.

(56) References Cited

U.S. PATENT DOCUMENTS

| | | | |
|---|---|---|---|
| 2002/0135293 A1* | 9/2002 | Aruga ................... | G02F 1/1345 313/493 |
| 2012/0001837 A1* | 1/2012 | Yamayoshi ............. | H01L 27/12 345/87 |

(Continued)

FOREIGN PATENT DOCUMENTS

| JP | 2003-223111 A | 8/2003 |
|---|---|---|
| JP | 2009-069768 A | 4/2009 |

(Continued)

OTHER PUBLICATIONS

International Searching Authority, International Search Report for PCT/KR2015/005333 dated Aug. 5, 2015 [PCT/ISA/210].

(Continued)

*Primary Examiner* — Phuc Dang
(74) *Attorney, Agent, or Firm* — Sughrue Mion, PLC (57) ABSTRACT

The present invention relates to a circular display device including: a substrate (21) having a circular shape; a plurality of data lines (15) formed on the substrate; a plurality of gate lines (16) extending in a direction orthogonal to the plurality of data lines; a plurality of pixels (14) respectively formed at areas in which the plurality of data lines and the plurality of gate lines intersect; and a circular cover (25) that is air-tightly adhered to the substrate and covers the pixels. The cover has a driving integrated circuit (27) and a plurality of wiring patterns formed thereon, wherein the driving integrated circuit supplies scan signals and data signals to (Continued)

the plurality of pixels, and the wiring patterns extend and are drawn out from the driving integrated circuit. The respective plurality of wiring patterns are electrically connected to each of the plurality of data lines and the plurality of gate lines through connection wires (29).

5 Claims, 8 Drawing Sheets

(56) References Cited

U.S. PATENT DOCUMENTS

2015/0221895 A1* 8/2015 Sato .................... H01L 27/3211
257/40
2015/0228799 A1* 8/2015 Koezuka ............... H01L 27/124
257/43

FOREIGN PATENT DOCUMENTS

| KR | 10-2007-0050801 A | 5/2007 |
| KR | 10-2012-0004119 A | 1/2012 |
| KR | 10-2014-0005404 A | 1/2014 |

OTHER PUBLICATIONS

International Searching Authority, Written Opinion for PCT/KR2015/005333 dated Aug. 5, 2015 [PCT/ISA/237].

* cited by examiner

CIRCULAR DISPLAY DEVICE AND MANUFACTURING METHOD THEREFOR

CROSS REFERENCE TO RELATED APPLICATIONS

This application is a National Stage of International Application No. PCT/KR2015/005333 filed May 28, 2015, claiming priority based on Korean Patent Application Nos. 10-2014-0066133 filed May 30, 2014 and 10-2014-0086834 filed Jul. 10, 2014, the contents of all of which are incorporated herein by reference in their entirety.

TECHNICAL FIELD

The present invention relates to a circular display device and a manufacturing method therefor, and more particularly, to a circular display device in which an appearance of a display part of the display device is circular and a manufacturing method therefor.

BACKGROUND ART

As a display device used for visually displaying information or data on a computer monitor, a television receiver, or the like, display devices such as a liquid crystal display (LCD) and an organic light emitting display (OLED) have been widely used. Generally, the LCD or the OLED has a quadrangular shape such as a squared shape or a rectangular shape.

Meanwhile, a smart watch such as a Galaxy Gear (registered trademark) that may put on a wrist, or the like has appeared in recent years. However, the smart watch or the like also uses a substantially quadrangular display device as a display part.

On the other hand, a demand for a display device using a circular display part having a feeling like the existing analog watch by getting out of the uniform shape such as the quadrangular shape has been increased.

Figure 1:
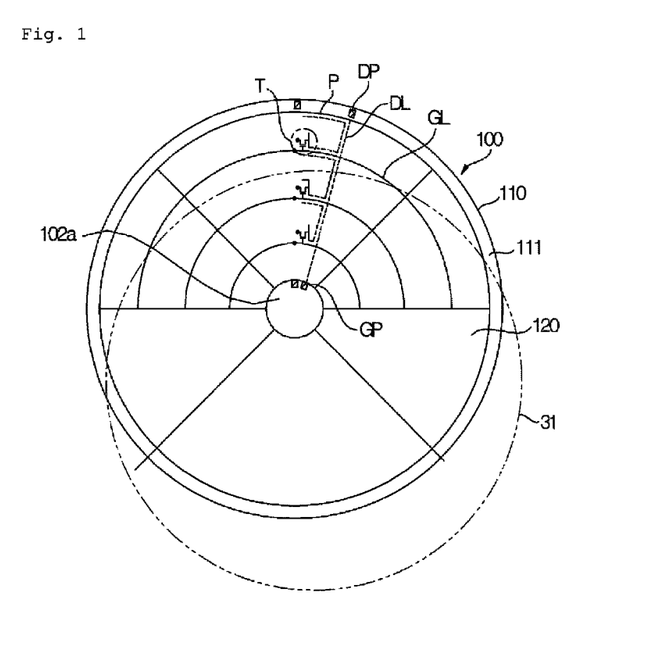
FIG. 1 is a view schematically showing a conventional circular liquid crystal display device.

As the circular display device, there is a technique described in Patent Document 1. FIG. 1 is a view schematically showing a conventional circular liquid crystal display device.

As shown in FIG. 1, a conventional circular liquid crystal display device 100 includes: a first circular substrate 110 and a second circular substrate 120 adhered to each other with a liquid crystal layer interposed therebetween, wherein an image is displayed on the first circular substrate 110; a circular display part 111 in which liquid crystal cells are arranged; and first and second non-display parts 102a and 102b which have pad parts disposed therein to receive various control signals, image signals and a driving voltage that are required to display the image applied thereto, and are formed at a central portion and a peripheral portion of the circular display part 111.

The circular display part 111 of the first circular substrate 110 includes a plurality of pixel areas P formed at an area in which a plurality of gate lines GL and a plurality of data lines DL intersect. In a case of the plurality of gate lines GL, lines thereof having a circumference smaller than that of the circular display part 111 are arranged in a row from a boundary portion of the circular display part 111 to the central portion, and in a case of the plurality of data lines DL, lines thereof are arranged so as to traverse across the central portion of the circular display part 111. The pixel areas P, which are defined by the gate and data lines, have an inverse trapezoidal shape in which a length of an upper side is long and a length of a lower side is short.

Further, each of the pixel areas P includes thin film transistors T formed at portions in which the gate lines GL with the data lines DL intersect to switch the liquid crystal cells, and pixel electrodes (not shown) connected to the thin film transistors T to drive the liquid crystal cells.

The first non-display part 102a of the first circular substrate 110 is provided with a gate pad part GP that is connected to the gate line GL to supply a scanning signal supplied from a gate driver integrated circuit to the gate line GL, and the second non-display part 102b is provided with a data pad part DP that is connected to the data line DL to supply image information supplied from a data driver integrated circuit to the data line DL.

However, the display device of the above Patent Document 1 has a problem in that the gate line GL and the data line DL need to have a circular shape, an in particular, the pixel area P forming the display part of the display device needs to have an inverse trapezoidal shape in which the length of the upper side is long and the length of the lower side is short. Therefore, it is very difficult to form the pixel area P having the inverse trapezoidal shape and form the gate line GL and the data line DL having a circular shape, in the manufacturing process of the display device.

Figure 2:
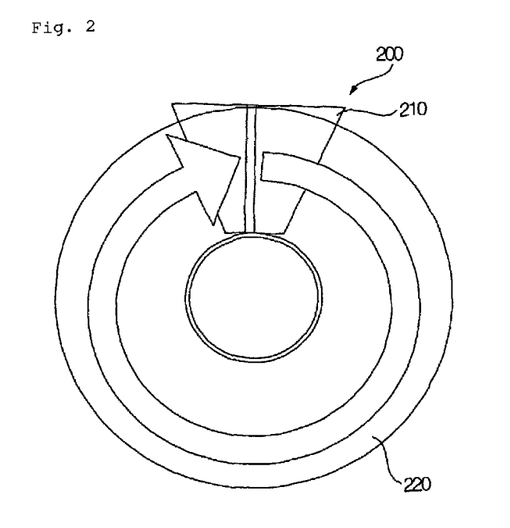
FIG. 2 is a schematic view showing another conventional circular display device.

Further, as another prior art related to the circular display device, there is a technique described in Patent Document 2. FIG. 2 is a schematic view showing another conventional circular display device.

The conventional circular display device as shown in FIG. 2 is a rollable type circular display device 200 which includes: a circular display part 220 that may be unfolded in two dimensions between a housed state and an unfolded state; and a housing 210 for winding the circular display part 220 in the housed state. Herein, the circular display part 220 is wound around a cone rotatably formed within the housing 210 while being disposed on the same shaft within the housing 210, and a state in which the circular display part 220 is housed within the housing 210 by being wound around the cone becomes the housed state, whereas a state in which the circular display part 220 is unfolded to an outside of the housing 210 by being unwound from the cone as shown by an arrow in FIG. 2, and thereby becoming a state that may be viewed from the outside as a whole, that is, the unfolded state shown in FIG. 2.

Further, the conventional circular display device of another prior art disclosed in Patent Document 2 has the same form as the Patent Document 1 in terms of the shape and disposition of the pixel area, and the disposition of the gate line and the data line.

Therefore, the circular display device of the Patent Document 2 has the same problem as the Patent Document 1 as described above.

In addition, the circular display device of the Patent Document 2 has two states, that is, the state in which the circular display part is housed and the state in which the circular display part is unfolded, and the circular display device is used with being unfolded in the unfolded state (state of FIG. 2) when using as the display device, and needs to be housed in the housed state when not using as the display device. Therefore, the circular display device has a problem in that it may be complicated in use and a configuration thereof for switching to the two states could be complicated.

Further, the circular display device of Patent Document 2 has a problem in that it may not be used as a purpose like the smart watch, for example.

PRIOR ART DOCUMENT

Patent Document

[Patent Document 1] Korean Patent Laid-Open Publication No. 10-2009-0059661 (laid-open on Jun. 11, 2009)
[Patent Document 2] Japanese Application Publication No. 2009-519496 (published on May 14, 2009)

DISCLOSURE

Technical Problem

In consideration of the above-mentioned circumstances, it is an object of the present invention to provide a circular display device having a substantially circular shape, in which each of the plurality of pixels forming a display part has the same shape as each of pixels of the conventional quadrangular display device, and gate lines and data lines for supplying signals to drive and control the plurality of pixels have the same disposition form as the gate lines and the data line of the conventional quadrangular display device.

Technical Solution

In order to accomplish the above object, according to an aspect of the present invention, there is provided a circular display device, including: a substrate having a circular shape; a plurality of data lines formed on the substrate while extending; a plurality of gate lines formed on the substrate while extending in a direction orthogonal to the plurality of data lines; a plurality of pixels respectively formed at areas in which the plurality of data lines and the plurality of gate lines intersect; and a circular cover which is air-tightly adhered to the substrate to cover the pixels, wherein the cover includes a driving integrated circuit formed thereon to supply scan signals and data signals to the plurality of pixels, and a plurality of wiring patterns which extend and are drawn out from the driving integrated circuit, and the respective plurality of wiring patterns and each of the plurality of data lines and the plurality of gate lines are electrically connected to each other by connection wires.

According to another aspect of the present invention, there is provided a circular display device, including: a substrate having a circular shape; a plurality of data lines formed on the substrate while extending; a plurality of gate lines formed on the substrate while extending in a direction orthogonal to the plurality of data lines; a plurality of pixels respectively formed at areas in which the plurality of data lines and the plurality of gate lines intersect; and a circular cover which is air-tightly adhered to the substrate to cover the pixels; an auxiliary substrate disposed on the cover, wherein the auxiliary substrate includes a driving integrated circuit formed thereon to supply scan signals and data signals to the plurality of pixels, and a plurality of wiring patterns which extend and are drawn out from the driving integrated circuit, and the respective plurality of wiring patterns and each of the plurality of data lines and the plurality of gate lines are electrically connected to each other by connection wires.

According to another aspect of the present invention, there is provided a circular display device, including: a substrate having a circular shape; a plurality of data lines formed on one surface of the substrate while extending; a plurality of gate lines formed on the one surface of the substrate while extending in a direction orthogonal to the plurality of data lines; and a plurality of pixels respectively formed at areas in which the plurality of data lines and the plurality of gate lines intersect, wherein the substrate includes a driving integrated circuit formed on the other surface thereof to supply scan signals and data signals to the plurality of pixels, and a plurality of wiring patterns which extend and are drawn out from the driving integrated circuit, and the respective plurality of wiring patterns and each of the plurality of data lines and the plurality of gate lines are electrically connected to each other through via holes formed in the substrate.

According to another aspect of the present invention, there is provided a manufacturing method for a circular display device, including: preparing a circular substrate including a plurality of data lines and a plurality of gate lines, and a plurality of pixels respectively formed at areas in which the plurality of data lines and the plurality of gate lines intersect; preparing a circular cover including integrated circuit for driving the pixels formed on one surface thereof and a plurality of wiring patterns which extend from the driving integrated circuit; air-tightly adhering the circular substrate and the circular cover to each other; electrically connecting the respective plurality of wiring patterns with each of the plurality of data lines or the plurality of gate lines, respectively, corresponding to the respective plurality of wiring patterns.

Advantageous Effects

According to the circular display device of, the integrated circuit for driving the pixels is disposed on the cover side, the wiring pattern for supplying the signals and data from the driving integrated circuit to the data line and the gate line of the pixel side is formed on the cover side, and the wiring pattern and each of the data line and the gate line on the pixel side are electrically connected to each other by a so-called wire bonding scheme to greatly reduce a width of a bezel for arranging the plurality of data lines and the plurality of gate lines while easily making the display part in a circular shape, such that the degree of freedom in a design of the display device may be improved and the display device suitable to wearing a human body like a smart watch may be provided.

BEST MODE

Hereinafter, a circular display device according to preferred embodiments of the present invention will be described in detail with reference to the accompanying drawings.

1. Embodiment 1

A circular display device according to preferred Embodiment 1 of the present invention will be described.

Figure 3:
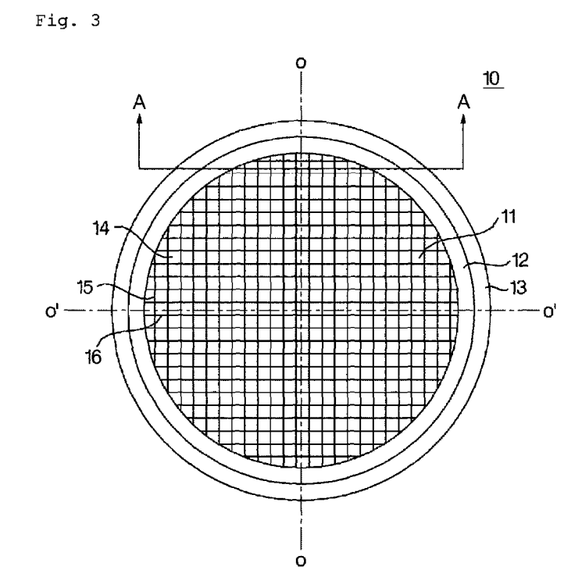
FIG. 3 is a plan view of a circular display device according to preferred Embodiment 1 of the present invention.
Figure 4:
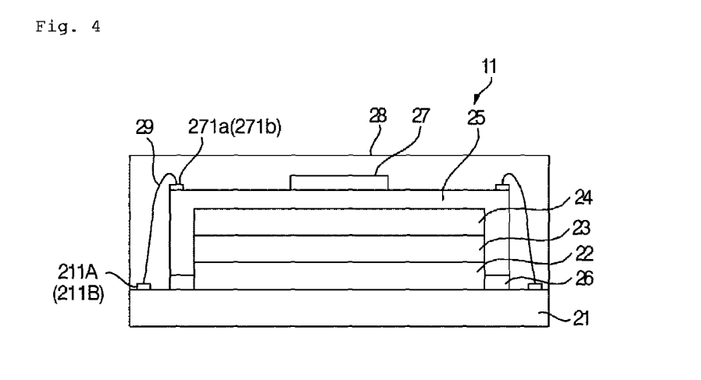
FIG. 4 is a cross-sectional view taken on line A-A of FIG. 3.
Figure 5A:
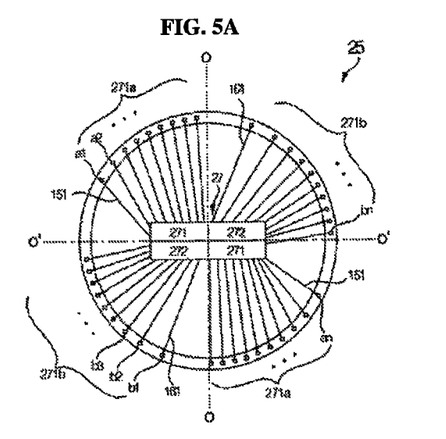
FIG. 5A and FIG. 5B are plan views showing an integrated circuit and a wiring pattern formed on a main substrate and a cover of the circular display device according to preferred Embodiment 1 of the present invention.
Figure 5B:
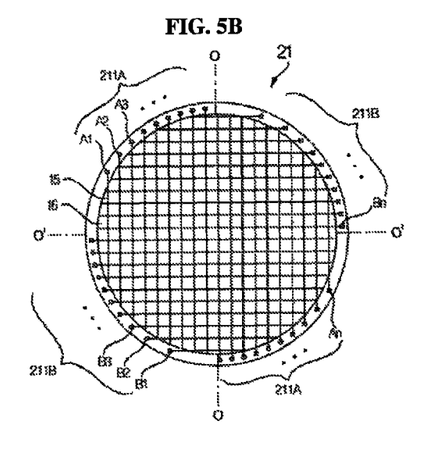

FIG. 3 is a plan view of the circular display device according to preferred Embodiment 1 of the present invention, FIG. 4 is a cross-sectional view taken on line A-A of FIG. 3, and FIG. 5A and FIG. 5B are a plan views showing an integrated circuit and a wiring pattern formed on a main substrate and a cover of the circular display device according to preferred Embodiment 1 of the present invention.

As shown in FIG. 3, a circular display device 10 according to Embodiment 1 includes: a display part 11; an adhesion part 12 located at an inside of an edge portion of the display part 11, in which a main substrate 21 and a cover 25 to be described below are adhered to each other; and a pad area 13 located at an outside of the adhesion part 12 of the edge portion of the display part 11 and provided with lower pad groups 211A and 211B for wire bonding to electrically connect an integrated circuit 27 to be described below with a data line 15 and a gate line 16 of the display part 11.

Further, the display part 11 includes a plurality of data lines 15 extending in a vertical direction of FIG. 3, a plurality of gate lines 16 extending in a direction (horizontal direction of FIG. 3) orthogonal to the data lines 15, and a plurality of pixels 14 respectively formed at areas in which the data lines 15 and the gate lines 16 intersect.

The display part 11 according to Embodiment 1 is basically the same as the display part of the conventional quadrangular display device, but the display part of the present embodiment is different from the display part of the quadrangular display device in that in the display part of the quadrangular display device, the plurality of data lines and the plurality of gate lines respectively have the same length as each other, and the plurality of pixels respectively formed at the area in which the plurality of data lines and the plurality of gate lines intersect also have the same number as each other in each row and each column, but in the display part 11 of the present embodiment, based on a horizontal central line O'-O' and a vertical central line O-O passing through a central point of the circular display part, the lengths of the respective data lines 15 are longest at the vertical central line O-O side and are gradually decreased toward an edge side of the display part 11, as well as the lengths of the gate lines 16 are also longest at the vertical central line O-O side and are gradually decreased toward the edge side of the display part 11.

Therefore, the display device of the present embodiment is different from the conventional quadrangular display device in that the number of areas in which the plurality of data lines 15 and the plurality of gate lines 16 intersect is largest at the horizontal central line O'-O' and the vertical central line O-O sides and is gradually reduced as distances from the horizontal central line O'-O' and the vertical central line O-O are increased, such that the number of pixels 14 per unit column or unit row is largest at the horizontal central line O'-O' and the vertical central line O-O sides and is gradually reduced as the distances from the horizontal central line O'-O' and the vertical central line O-O are increased.

As a light emitting device for each pixel 14 forming the display part 11, the present embodiment uses an organic electroluminescent device, and includes a driving unit that includes, although not shown in FIGS. 3 and 4, a thin film transistor and a capacitor to drive the organic electroluminescent device. All of these components have the technical configurations known in the art, and will not be described in detail herein.

As shown in FIG. 4, the display part 11 of the present embodiment includes: a circular main substrate 21 formed of a transparent substrate made of glass, plastic, or the like; a first electrode 22 formed on the main substrate 21 and made of ITO, or the like; an organic light emitting layer 23 formed on the first electrode 22; a second electrode 24 formed on the organic light emitting layer 23 and made of metal materials such as aluminum; and a cover 25 encapsulating the first electrode 22, the organic light emitting layer 23, and the second electrode 24, wherein the cover 25 is adhered to the main substrate 21 by an adhesive coated on an adhesive layer 26. Meanwhile, all of these components also have the technical configurations known in the art, and will not be described in detail herein.

Although not shown in FIG. 4, the plurality of data lines 15 and the plurality of gate lines 16 respectively extend toward the edge side of the main substrate 21 on an upper surface of the main substrate 21, and if necessary, end portions of extensions of the plurality of data lines 15 and the plurality of gate lines 16 are respectively provided with a plurality of pads 211A and 211B.

According to the feature of the present embodiment, an integrated circuit 27 is disposed on a surface opposite to the main substrate 21 side of the cover 25 and the integrated circuit 27 is disposed on the cover 25 by a chip on glass (COG) scheme, a chip on flexible printed circuit (COF) scheme, a tape carrier package (TCP) scheme, or the like.

The integrated circuit 27 includes a gate driver applying a scan signal to the plurality of pixels 14 to select a specific row, a data driver applying a data signal to a pixel of the selected specific row, a timing controller applying a timing signal to the gate driver and the data driver, or the like. FIG. 5A and FIG. 5B show one integrated circuit 27, but if necessary, the data driver, the gate driver and the timing controller may be included within one integrated circuit, and each of them may be included in separate integrated circuits.

In the present embodiment, the data driver, the gate driver and the timing controller may be preferably included in one integrated circuit, which will be described in detail with reference to FIG. 5A and FIG. 5B.

FIG. 5A is a plan view showing a wiring pattern of the cover 25 having the integrated circuit 27, and FIG. 5B is a plan view showing a wiring pattern of the main substrate 21 having the data line 15 and the gate line 16.

First, in FIG. 5A, the integrated circuit 27 is disposed at substantially the central portion of the surface opposite to the main substrate 21 side of the cover 25 by any one of the COG, COF and TCP schemes, and the integrated circuit 27 is partitioned into four areas. Among the four areas, two areas facing each other on a diagonal line are data drivers 271 and 271 and the other two areas are gate drivers 272 and 272. Meanwhile, the timing controller is not shown in FIG. 5A and FIG. 5B.

Further, a plurality of data patterns 151 and a plurality of gate patterns 161 respectively extend from the data drivers 271 and 271 and the gate drivers 272 and 272 toward an end portion of an edge side of the cover 25, and the data pattern 151 and the gate pattern 161 respectively have upper pads 271a and 271b formed at end portions thereof.

That is, the cover 25 is partitioned into four areas by the horizontal central line O'-O' and the vertical central line O-O, and among the four partitioned areas, the areas facing each other on the diagonal line are provided with the plurality of data patterns 151 and the other two areas are provided with the gate patterns 161. Therefore, among the four areas partitioned by the horizontal central line O'-O' and the vertical central line O-O on the surface opposite to the main substrate 21 side of the cover 25, any two areas facing each other on the diagonal line are a data pattern area and the other two areas are a gate pattern area, the upper pad 271a is formed at the end portion of the data pattern 151 of the edge side of the cover 25, and the upper pad 271b is formed at the end portion of the data pattern 151 at the edge side of the cover 25.

Upper pad groups 271a and 271b include a plurality of data pattern upper pads a1, a2, a3, . . . and an and a plurality of gate pattern upper pads b1, b2, b3, . . . and bm. Herein, the plurality of data pattern upper pads a1, a2, a3, . . . and an are disposed fifty-fifty in each of the two areas facing each other on the diagonal line, and the plurality of gate pattern upper pads b1, b2, b3, . . . and bm are disposed fifty-fifty in each of the other two areas facing each other on the diagonal line.

Further, as shown in FIG. 5B, the main substrate 21 includes the plurality of data lines 15 and the plurality of gate lines 16 formed in an intersecting direction to each other as described above. These plurality of data lines 15 and plurality of gate lines 16 respectively extend toward the end portion of the edge portion of the main substrate 21, and the pad areas 13 that are end portions of the extension are respectively provided with lower pad groups 211A and 211B.

The lower pad groups 211A and 211B include a plurality of data line lower pads A1, A2, A3, . . . and An and a plurality of gate line lower pads B1, B2, B3, . . . and Bm. Herein, the plurality of data line lower pads A1, A2, A3, . . . and An are disposed fifty-fifty in each of the two pad areas 13 facing each other on the diagonal line, and the plurality of gate line lower pads B1, B2, B3, . . . and Bm are disposed fifty-fifty in each of the rest two pad areas 13 facing each other on the diagonal line.

The number of data patterns 151 and gate patterns 161 formed on the cover 25 and the number of upper pads 271a and 271b formed at each of the end portions thereof are equal to the number of data lines 15 and gate lines 16 formed on the main substrate 21 and the number of lower pad groups 211A and 211B formed at each of the end portions thereof.

As a result, after the cover 25 is adhered to the main substrate 21, the upper pad groups 271a and 271b and the lower pad groups 211A and 211B, which respectively correspond thereto, are electrically connected to each other by a wire bonding process.

In detail, the data pattern upper pad a1 on the cover 25 is electrically connected to the data line lower pad A1 on the main substrate 21 by a connection wire 29, the data pattern upper pad a2 on the cover 25 is electrically connected to the data line lower pad A2 on the main substrate 21 by the connection wire 29, . . . and the data pattern upper pad an on the cover 25 is electrically connected to the data line lower pad An on the main substrate 21 by the connection wire 29.

Further, the gate pattern upper pad b1 on the cover 25 is electrically connected to the data line lower pad B1 on the main substrate 21 by the connection wire 29, the gate pattern upper pad b2 on the cover 25 is electrically connected to the gate line lower pad B2 on the main substrate 21 by the connection wire 29, . . . and the gate pattern upper pad bm on the cover 25 is electrically connected to the gate line lower pad Bm on the main substrate 21 by the connection wire 29.

Preferably, as shown in FIG. 4, each of the upper pads 271a and 271b and each of the lower pad groups 211A and 211B are disposed at positions in which, when the cover 25 is adhered to the main substrate 21 and then the cover and the main substrate 21 are connected to each other by the connection wire 29, a length of the connection wire 29 is shortest, that is, positions in which a distance between the upper pads 271a and 271b and the lower pad groups 211A and 211B, which respectively correspond thereto, is shortest.

Further, the display part 11 according to the present embodiment includes a protective layer 28 that protects the integrated circuit 27 and various types of wirings and patterns, or the like. Herein, the protective layer 28 has the technical configuration known in the art, and will not be described in detail.

Further, although not shown in the drawings, if necessary, the display part 11 may further include a connector for supplying various signals and data including a power from the outside of the display part 11 to the integrated circuit 27 disposed on the cover 25.

Next, a manufacturing method for the circular display device 10 according to the present embodiment will be described.

First, the main substrate 21, on which the plurality of data lines 15 and the plurality of gate lines 16, the thin film transistors for driving pixels formed at the areas in which the data and gate lines intersect, and the pixels 14 including the first electrodes 22, the organic light emitting layers 23 and the second electrodes 24 are formed, is manufactured.

Further, the cover 25 is manufactured together with the manufacturing of the main substrate 21.

The cover 25 is provided with the integrated circuit 27 for driving the circular display device 10 according to the present invention by the known schemes such as the COG scheme, the COF scheme and the TCP scheme, and the plurality of data patterns 151 and the plurality of gate patterns 161, or the like that transfer the signals or the data from the integrated circuit 27 to the plurality of data lines 15 and the plurality of gate lines 16, or the like on the main substrate 21 are formed by the known method.

Next, the main substrate 21 and the cover 25 are air-tightly adhered to each other by the known method in a state in which the main substrate 21 and the cover 25 are aligned with each other to be positioned.

Next, the wire bonding process of electrically connecting each of the plurality of data lines 15 on the main substrate 21 with each of the plurality of data patterns 151 on the cover 25 corresponding thereto by the connection wire 29 is performed. As the connection wire 29, gold, aluminum, or the like may be used. However, since gold has a process temperature of about 150° C. in the bonding process, which is a relatively high temperature, aluminum that may perform the wire bonding process at room temperature is more preferably used than gold.

Next, the protective layer 28 that protects the main substrate 21 and the cover 25 adhered to each other is formed by the known method, such that the circular display device 10 according to the present embodiment is manufactured.

The manufacturing method for a circular display device 10 in a single product type is described above, but it is preferable that several circular display devices 10 are simultaneously manufactured on a large substrate and then are divided into the individual circular display device 10.

In this case, a process of dividing a large substrate on which several circular display devices 10 are formed in a unit of an individual circular display device 10 is further required. The dividing process may be performed after performing the adhering process, performed after performing the wire bonding process, and performed after the process of forming a protective layer 28 in some cases. Further, even when the dividing process is performed before the wire bonding process, the diving process may be performed before the process of adhering the main substrate 21 to the cover 25, and the dividing process may be performed between the adhering process and the wire bonding process.

As described above, in the circular display device 10 according to Embodiment 1, the integrated circuit for driving the pixels is disposed on the cover side, the wiring pattern for supplying the signals and data from the driving integrated circuit to the data line and the gate line of the pixel side is formed on the cover side, and the wiring pattern and each of the data line and the gate line on the pixel side are electrically connected to each other by a so-called wire bonding scheme to greatly reduce a width of a bezel for arranging the plurality of data lines and the plurality of gate lines while easily making the display part in a circular shape, such that the degree of freedom in a design of the display device may be improved and the display device suitable to wearing a human body like a smart watch may be provided.

2. Embodiment 2

Next, preferred Embodiment 2 of the present invention will be described.

A difference between a circular display device 30 according to Embodiment 2 and the circular display device 10 according to Embodiment 1 is that in Embodiment 1, the integrated circuit 27, and the data pattern 151 and the gate pattern 161, or the like are formed on a back surface of the cover 25, but in Embodiment 2, a substrate for a driving integrated circuit in addition to the cover 25 is further provided. However, other components of Embodiment 2 are substantially the same as Embodiment 1.

In Embodiment 2, components different from those of Embodiment 1 will be mainly described. The same components as those of Embodiment 1 are denoted by the same reference numerals and will be briefly described only within the required range.

Figure 6:
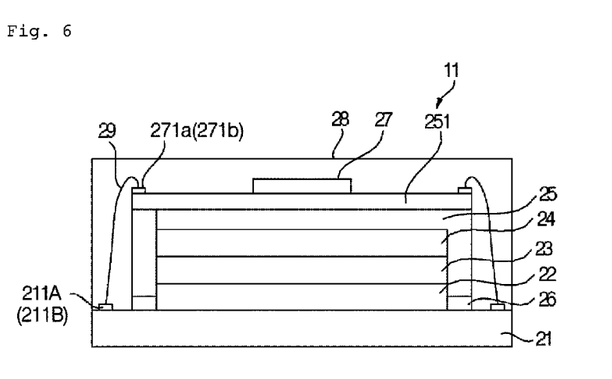
FIG. 6 is a cross-sectional view of a circular display device according to preferred Embodiment 2 of the present invention.

FIG. 6 is a cross-sectional view of the circular display device according to preferred Embodiment 2 of the present invention.

The circular display device 30 according to Embodiment 2 includes: the main substrate 21; the plurality of data lines 15 formed on the main substrate 21; the plurality of gate lines 16 arranged in the direction orthogonal to the plurality of data lines 15; and the plurality of pixels 14 respectively formed at the area in which the plurality of data lines 15 and the plurality of gate lines 16 intersect.

Further, the main substrate 21 has the adhesion part 12 at the edge portion thereof and the pad area 13 disposed at the outside of the adhesion part 12. The plurality of data lines 15 and the plurality of gate lines 16 on the pad area 13 respectively include the lower pad groups 211A and 211B formed at the end portions thereof.

As shown in FIG. 6, the plurality of pixels 14 include: the first electrodes 22 formed at each of the intersection areas; the organic light emitting layers 23 formed on the first electrode 22; the second electrodes 24 formed on the organic light emitting layer 23; and the cover 25 covering them. Herein, the cover 25 is air-tightly adhered to the main substrate 21 with an adhesive layer 26 interposed therebetween.

An auxiliary substrate 251 for IC is bonded to the upper portion of the cover 25, the integrated circuit 27 is disposed on the surface opposite to the main substrate 21 side of the auxiliary substrate 251 by the known schemes such as the COG scheme, the COF scheme and the TCP scheme. In addition, the data pattern 151 and the gate pattern 161 transferring the signal or the data from the integrated circuit 27 to the data line 15 and the gate line 16 on the main substrate 21 extend toward an end portion of an edge portion of the auxiliary substrate 251.

Further, the data pattern 151 and the gate pattern 161 include the upper pad groups 271a and 271b formed at the end portions thereof. The arrangement method of the integrated circuit 27, the data pattern 151, the gate pattern 161, and the upper pad groups 271a and 271b on the auxiliary substrate 251 is the same as Embodiment 1 of FIG. 5A.

Further, according to the manufacturing method for the circular display device 30 of Embodiment 2, the manufacturing process of the cover 25 of the present embodiment is different from that of Embodiment 1 in that the cover is not provided with the wiring pattern including the integrated circuit 27 on the cover 25, and these parts are formed on the auxiliary substrate 251. Therefore, the present embodiment is substantially the same as Embodiment 1 except that the auxiliary substrate 251, on which the integrated circuit 27, the data pattern 151 and the gate pattern 161, and the upper pad groups 271a and 271b are formed, is separately prepared, and thus the auxiliary substrate 251 is adhered to the cover 25 air-tightly adhered to the main substrate 21, will not be described in detail.

As described above, according to the circular display device 30 of Embodiment 2, the same effect as the circular display device 10 of Embodiment 1 can be obtained, and the driving integrated circuit and various wiring patterns are formed on the separate IC substrate, not on the cover, and therefore the degree of freedom in the cover configuration can be increased.

3. Embodiment 3

Next, a circular display device according to preferred Embodiment 3 of the present invention will be described.

Figure 7:
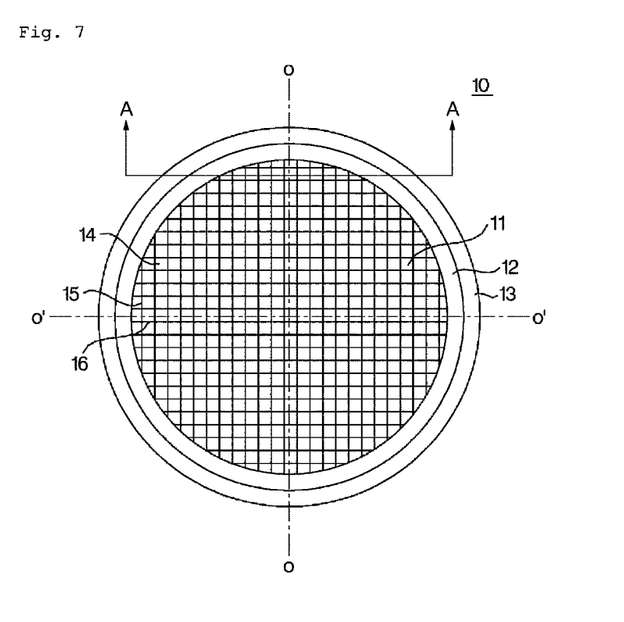
FIG. 7 is a plan view of the circular display device according to preferred Embodiment 3 of the present invention.
Figure 8:
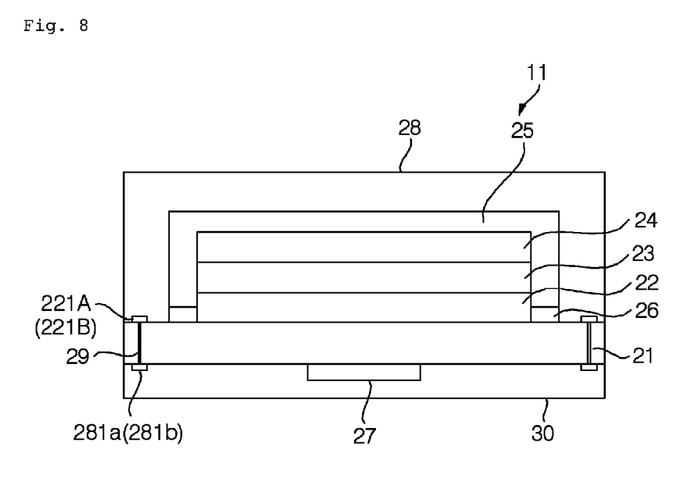
FIG. 8 is a cross-sectional view taken on line A-A of FIG. 7.
Figure 9A:
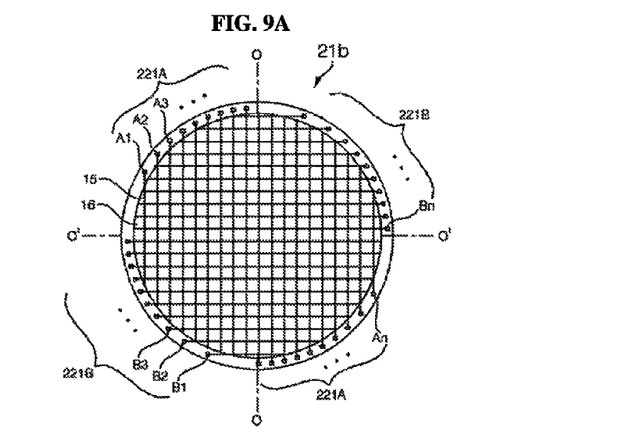
FIG. 9A and FIG. 9B are plan views showing an integrated circuit and a wiring pattern formed on a substrate and a cover of the circular display device according to preferred Embodiment 3 of the present invention.
Figure 9B:
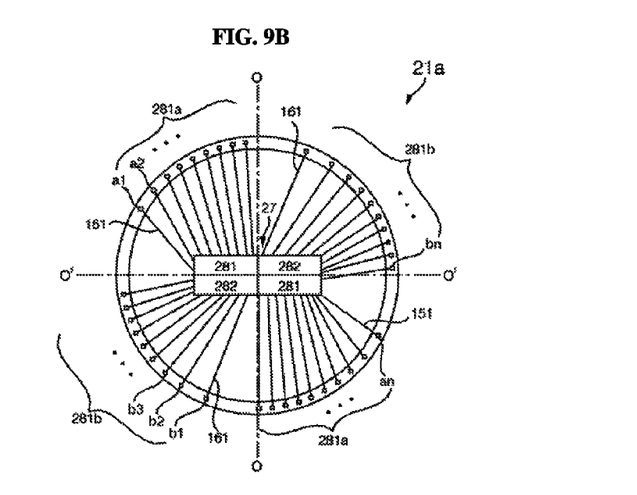
Figure 10A:
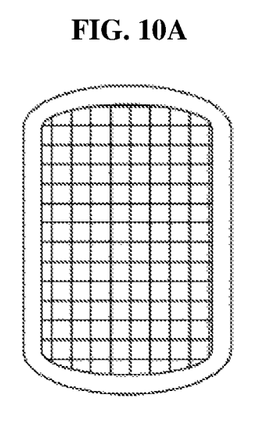
FIG. 10A, FIG. 10B, FIG. 10C, and FIG. 10D are views showing an example of various shapes of the display part.
Figure 10B:
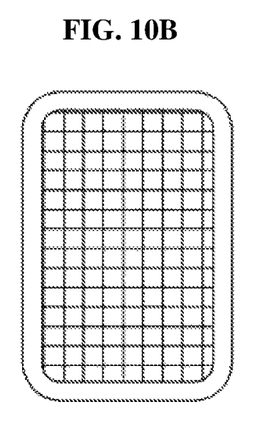
Figure 10C:
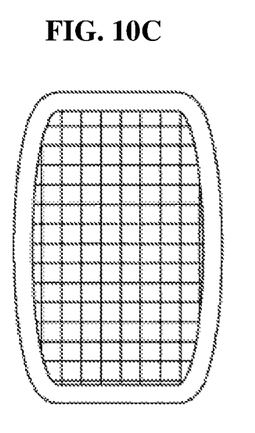
Figure 10D:
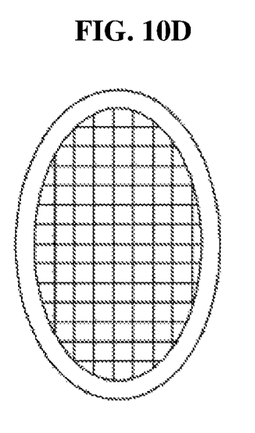

FIG. 7 is a plan view of the circular display device according to the preferred embodiment of the present invention, FIG. 8 is a cross-sectional view taken on line A-A of FIG. 7, and FIG. 9A and FIG. 9B are plan views showing an integrated circuit and a wiring pattern formed on a substrate and a cover of the circular display device according to the preferred embodiment of the present invention.

As shown in FIG. 7, a circular display device 10 according to the present embodiment includes: the display part 11; the adhesion part 12 located at the inside of the edge portion of the display part 11, in which the main substrate 21 and the cover 25 to be described below are adhered to each other; and the pad area 13 located at the outside of the adhesion part 12 of the edge portion of the display part 11 and provided with the upper pad groups 221A and 221B for connection to electrically connect the integrated circuit 27 to be described below with the data line 15 and the gate line 16 of the display part 11.

Further, the display part 11 includes the plurality of data lines 15 extending in the vertical direction of FIG. 7, the plurality of gate lines 16 extending in a direction (horizontal direction of FIG. 7) orthogonal to the data lines 15, and the plurality of pixels 14 respectively formed at areas in which the data lines 15 and the gate lines 16 intersect.

The display part 11 according to the present embodiment is basically the same as the display part of the conventional quadrangular display device, but in the display part of the quadrangular display device, the plurality of data lines and the plurality of gate lines respectively have the same length as each other, and the plurality of pixels respectively formed at the area in which the plurality of data lines and the plurality of gate lines intersect also have the same number as each other in each row and each column. However, in the display part 11 of the present embodiment, based on the horizontal central line O'-O' and the vertical central line O-O passing through a central point of the circular display part, there is a difference in that the lengths of the respective data lines 15 are longest at the vertical central line O-O side and are gradually decreased toward the edge side of the display part 11, as well as the lengths of the gate lines 16 are also longest at the vertical central line O-O side and are gradually decreased toward the edge side of the display part 11.

Therefore, the display device of the present embodiment is different from the conventional quadrangular display device in that the number of areas in which the plurality of data lines 15 and the plurality of gate lines 16 intersect is largest at the horizontal central line O'-O' and the vertical central line O-O sides and is gradually reduced as the distances from the horizontal central line O'-O' and the vertical central line O-O are increased, such that the number of pixels 14 per unit column or unit row is largest at the horizontal central line O'-O' and the vertical central line O-O sides and is gradually reduced as the distances from the horizontal central line O'-O' and the vertical central line O-O are increased.

As the light emitting device for each pixel 14 forming the display part 11, the present embodiment uses an organic electroluminescent device, and includes a driving unit that includes, although not shown in FIG. 7, a thin film transistor and a capacitor to drive the organic electroluminescent device. All of these components have the technical configurations known in the art, and will not be described in detail herein.

As shown in FIG. 8, the display part 11 of the present embodiment includes: the circular substrate 21 formed of a transparent substrate made of glass, plastic, or the like; the first electrode 22 formed on the substrate 21; the organic light emitting layer 23 formed on the first electrode 22; the second electrode 24 formed on the organic light emitting layer 23; and a cover 25 encapsulating the first electrode 22, the organic light emitting layer 23, and the second electrode 24. The cover 25 is adhered to the substrate 21 by an adhesive coated on the adhesive layer 26. Meanwhile, all of these components also have the technical configurations known in the art, and will not be described in detail herein.

The plurality of data lines 15 and the plurality of gate lines 16 respectively extend toward the edge side of the substrate 21 on an upper surface of the main substrate 21, and if necessary, the end portions of extensions of the plurality of data lines 15 and the plurality of gate lines 16 are respectively provided with the plurality of upper pads 221A and 221B.

According to the features of the present embodiment, a surface (hereinafter, referred to as a 'back surface of the substrate 21') opposite to the surface on which the first electrode 22 of the substrate 21 is formed is provided with the integrated circuit 27. Herein, the integrated circuit 27 is disposed on the back surface of the first electrode 22 by the schemes such as the chip on glass (COG) scheme, the chip on flexible printed circuit (COF) scheme and the tape carrier package (TCP) scheme.

The integrated circuit 27 includes a gate driver applying a scan signal to the plurality of pixels 14 to select a specific row, a data driver applying a data signal to a pixel of the selected specific row, a timing controller applying a timing signal to the gate driver and the data driver, or the like. FIG. 9A and FIG. 9B show one integrated circuit 27, but if necessary, the data driver, the gate driver and the timing controller may be included within one integrated circuit and each of them may be included in separate integrated circuits.

In the present embodiment, the data driver, the gate driver and the timing controller may be preferably included in one integrated circuit, which will be described in detail with reference to FIG. 9A and FIG. 9B.

FIG. 9A is a plan view showing the wiring pattern formed on a side surface (hereinafter, referred to as an 'upper surface of the substrate 21') of the first electrode 22 of the substrate 21 having the integrated circuit 27, and FIG. 9B is a plan view showing the wiring pattern on the back surface of the substrate 21.

First, as shown in FIG. 9A, the upper surface of the substrate 21 is provided with the plurality of data lines 15 and the plurality of gate lines 16 in the direction in which these lines intersect as described above, and the plurality of data lines 15 and the plurality of gate lines 16 extend toward the end portion of the edge of the substrate 21, and the pad areas 13 that are the end portions of the extension are respectively formed with the upper pad groups 221A and 221B.

The upper pad groups 221A and 221B includes the plurality of data line lower pads a1, a2, a3, . . . and an and the plurality of gate line upper pads B1, B2, B3, . . . and Bm. Herein, the plurality of data line lower pads a1, a2, a3, . . . and an are disposed fifty-fifty in each of the two pad areas 13 facing each other on the diagonal line and the plurality of gate line upper pads B1, B2, B3, . . . and Bm are disposed fifty-fifty in each of the rest two pad areas 13 facing each other on the diagonal line.

Further, as shown in FIG. 9B, the integrated circuit 27 is disposed at substantially the central portion of the back surface of the substrate 21 of the cover by any one of the COG, COF and TCP schemes, and the integrated circuit 27 is partitioned into four areas. Among the four areas, two areas facing each other on the diagonal line are data drivers 281 and 281 and the other two areas are gate drivers 282 and 282. Meanwhile, the timing controller is not shown in FIG. 9A and FIG. 9B.

Further, the plurality of data patterns 151 and the plurality of gate patterns 161 respectively extend from the data drivers 281 and 281 and the gate drivers 282 and 282 toward the end portion of the edge of the cover 25. The data pattern 151 and the end portion of the gate pattern 161 respectively include lower pad groups 281a and 281b formed at the end portion thereof.

That is, the back surface of the substrate 21 is partitioned into four areas by the horizontal central line O'-O' and the vertical central line O-O, and among the four partitioned areas, the areas facing each other on the diagonal line are provided with the plurality of data patterns 151 and the other two areas are provided with the gate patterns 161. Therefore, among the four areas partitioned by the horizontal central line O'-O' and the vertical central line O-O on the surface opposite to the substrate 21 of the cover 25, any two areas facing each other on the diagonal line are a data pattern area and the other two areas are a gate pattern area, the lower pad group 281a is formed at the end portion of the data pattern 151 of the edge side of the back surface of the substrate 21, and the lower pad group 281b is formed at the end portion of the data pattern 151 at the edge side of the back surface of the substrate 21.

The lower pad groups 281a and 281b include a plurality of data pattern lower pads a1, a2, a3, . . . and an and a plurality of gate pattern lower pads b1, b2, b3, . . . and bm. Herein, the plurality of data pattern lower pads a1, a2, a3, . . . and an are disposed fifty-fifty in each of the two areas facing each other on the diagonal line, and the plurality of gate pattern lower pads b1, b2, b3, . . . and bm are disposed fifty-fifty in each of the other two areas facing each other on the diagonal line.

The number of data patterns 151 and gate patterns 161 formed on the back surface of the substrate 21 and the number of lower pad groups 281a and 281b respectively formed at the end portions thereof are equal to the number of data lines 15 and gate lines 16 formed on the substrate 21 and the number of upper pad groups 221A and 221B respectively formed at the end portions thereof.

Further, the pad area 13 of the edge portion of the substrate 21 is provided with a plurality of via holes 29 through which the plurality of upper pad groups 221A and 221B and the plurality of lower pad groups 281a and 281b penetrate to be communicated with each other, and an inner wall of the via hole 29 is coated with a conductive material.

Therefore, the plurality of upper pad groups 221A and 221B and the plurality of lower pad groups 281a and 281b formed on the upper surface and the back surface of the substrate 21, respectively, are electrically connected to the pads corresponding to each other through each of the plurality of via holes 29.

In detail, the data pattern upper pad a1 on the back surface of the substrate 21 is electrically connected to the data line upper pad A1 on the substrate 21 through the via hole 20, the data pattern lower pad a2 on the back surface of the substrate 21 is also electrically connected to the data line upper pad A2 on the substrate 21 through the via hole 29, . . . and the data line lower pattern an on the back surface of the substrate 21 is electrically connected to the data line upper pad An on the back surface of the substrate 21 through the via 29.

Further, the gate pattern lower pad b1 on the back surface of the substrate 21 is electrically connected to the gate line upper pad B1 on the substrate 21 through the via hole 29, the gate pattern lower pad b2 on the back surface of the substrate 21 is electrically connected to the gate line upper pad B2 on the substrate 21 through the via hole 29, . . . and the gate pattern lower pattern bm on the back surface of the substrate 21 is electrically connected to the gate line upper pad Bm an on the substrate 21 through the via 29.

By the connection as described above, image signals from the data drivers 281 and 281 and scan signals from the gate drivers 282 and 282 in the integrated circuit 27 for driving are selectively applied to the plurality of pixels 14 of the display part 11.

Further, the display part 11 according to the present embodiment includes protective layers 28 and 30 formed on the upper portion and the back surface of the substrate 21 to protect the integrated circuit 27 and various wirings and patterns, or the like. Herein, the protective layers 28 and 30 have the technical configurations known in the art, and will not be described in detail.

Further, although not shown in the drawings, if necessary, the display part 11 may further include a connector for supplying various signals and data including a power from the outside of the display part 11 to the integrated circuit 27 disposed on the cover 25.

As described above, in the circular display device 10 according to the present embodiment, the integrated circuit for driving the pixels is disposed at the back surface of the substrate 21, the wiring pattern for supplying the signal or data from the driving integrated circuit to the data line and the gate line of the pixel side is also formed at the back surface of the substrate 21, such that the wiring pattern and the each of the data line and the gate line on the pixel side are electrically connected to each other through the so-called via hole 29 to greatly reduce a width of the bezel for arranging the plurality of data lines and the plurality of gate lines while easily making the display part in a circular shape. Thereby, the degree of freedom in a design of the display device may be improved and the display device suitable to wearing a human body like a smart watch may be provided.

In the foregoing description, the case, in which the display part of the display device is a complete circle, is described by way of example, but in the present specification and claims, the term 'circular display device' means including all the display devices having shapes recognized as the circle when the display part included in the display device is viewed from human eyes.

Further, the term 'circle' not only includes the case in which the whole of the display part is a true circle and is an oval, but also includes, for example, the shape in which a straight portion is included in a part of the edge of the display part as shown in FIG. 10A, FIG. 10B, FIG. 10C, and FIG. 10D.

While the present invention has been described with reference to the preferred embodiments, the present invention is not limited to the above-described embodiments, and it will be understood by those skilled in the related art that various modifications and variations may be made within the scope of the technical idea of the present invention.

Embodiments 1, 2 and 3 mainly describe the basic components required for the pixel of the display device as described above, but it is not limited thereto, and may further include the components known in the art in addition to the components described Embodiments 1, 2 and 3.

Further, in Embodiments 1, 2 and 3, all of the gate driver and the data driver are disposed on the cover or the IC substrate as described above, but it is not limited thereto. For example, any one of the gate driver and the data driver may be disposed on the main substrate and only the other driver may be disposed on the cover or the IC substrate. In this case, the number of connection wires can be remarkably reduced.

Further, in Embodiments 1 and 2 describe, by way of example, the organic light emitting display using an organic electroluminescent device as a light emitting device, but it is not limited thereto, and may use a liquid crystal display device. Further, the above-described embodiments may be applied to an active organic light emitting display diode and a passive organic light emitting diode as the organic light emitting diode.

The embodiments and the modified examples may be performed alone or in a combination of some or all thereof.

DESCRIPTION OF REFERENCE NUMERALS 10, 30 circular display device,
11 display part 12 adhesion part,
13 pad area
14 pixel,
15 data line
16 gate line,
21 main substrate
22 first electrode,
23 organic light emitting layer
24 second electrode,
25 cover
26 adhesive layer,
27 integrated circuit
28 protective layer,
251 auxiliary substrate

The invention claimed is:

1. A circular display device, comprising:
    a substrate having a circular shape;
    a plurality of data lines formed on the substrate while extending;
    a plurality of gate lines formed on the substrate while extending in a direction orthogonal to the plurality of data lines;
    a plurality of pixels respectively formed at areas in which the plurality of data lines and the plurality of gate lines intersect; and
    a circular cover which is air-tightly adhered to the substrate to cover the pixels,
    wherein the cover includes a driving integrated circuit formed thereon to supply scan signals and data signals to the plurality of pixels, and a plurality of wiring patterns which extend and are drawn out from the driving integrated circuit, and
    the respective plurality of wiring patterns and each of the plurality of data lines and the plurality of gate lines are electrically connected to each other by connection wires.

2. The circular display device of claim 1, further comprising: a protective layer which covers the cover and the connection wire.

3. The circular display device of claim 1, wherein the driving integrated circuit is partitioned into four areas,
    among the four partitioned areas, two areas facing each other on a diagonal line are a data driver configured to generate a data signal, and
    among the four partitioned areas, the other two areas are a gate driver configured to generate a gate signal.

4. The circular display device of claim 3, wherein the cover is partitioned into four areas by central lines orthogonal to each other,
    among the four partitioned areas, two areas corresponding to the data driver are provided with a plurality of data patterns which respectively extend from the data driver to an edge side of the cover, and
    among the four partitioned areas, the other two areas are provided with a plurality of gate patterns which respectively extend from the gate driver to the edge side of the cover.

5. The circular display device of claim 4, wherein the substrate is partitioned into four areas by central lines orthogonal to each other,
    among the four partitioned areas, each of the two areas corresponding to the area, in which the data pattern is formed, is provided with the plurality of data lines which respectively extend to an edge side of the substrate, and
    among the four partitioned areas, the other two areas are provided with the plurality of gate lines which respectively extend to the edge side of the substrate.

* * * * *